(12) United States Patent
Choi et al.

(10) Patent No.: US 11,264,587 B2
(45) Date of Patent: *Mar. 1, 2022

(54) DISPLAY APPARATUS HAVING A LARGER DISPLAY REGION AND MOISTURE IMPERMEABILITY

(71) Applicant: SAMSUNG DISPLAY CO., LTD., Yongin-si (KR)

(72) Inventors: Jonghyun Choi, Yongin-si (KR); Hyunsun Park, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/421,946

(22) Filed: May 24, 2019

(65) Prior Publication Data

US 2019/0288232 A1 Sep. 19, 2019

Related U.S. Application Data

(63) Continuation of application No. 15/654,265, filed on Jul. 19, 2017, now Pat. No. 10,319,938.

(30) Foreign Application Priority Data

Jul. 19, 2016 (KR) .......................... 10-2016-0091436

(51) Int. Cl.
*H01L 51/50* (2006.01)
*H01L 51/52* (2006.01)
(Continued)

(52) U.S. Cl.
CPC ........ *H01L 51/5237* (2013.01); *H01L 27/124* (2013.01); *H01L 27/3274* (2013.01);
(Continued)

(58) Field of Classification Search
CPC ............ H01L 51/5237; H01L 51/5253; H01L 27/124; H01L 27/3274; H01L 51/5056;
(Continued)

(56) References Cited

U.S. PATENT DOCUMENTS 7,671,532 B2   3/2010  Kim
9,190,630 B2  11/2015  Kim et al.
(Continued)

FOREIGN PATENT DOCUMENTS

JP    2014-96355    5/2014
JP    2014-187283   10/2014
(Continued)

*Primary Examiner* — Nelson Garces
(74) *Attorney, Agent, or Firm* — F. Chau & Associates, LLC

(57) ABSTRACT

A display apparatus includes a substrate having a first region and a second region surrounding the first region. An insulating part is disposed above the substrate, covering the first region and the second region, and comprising a first opening portion in the second region. A dam part is disposed above the insulating pan in the second region and surrounds a periphery of the first opening portion. A first organic insulating layer is disposed above the insulating part and covers an inner surface of the first opening portion. An organic light-emitting device is disposed above the insulating part in the first region and comprises a pixel electrode. An encapsulation layer is disposed above the insulating part in both the first region and the second region. The encapsulation layer covers the organic light-emitting device.

20 Claims, 16 Drawing Sheets

(51) Int. Cl.
  *H01L 27/12* (2006.01)
  *H01L 27/32* (2006.01)
(52) U.S. Cl.
  CPC ...... *H01L 51/5056* (2013.01); *H01L 51/5253* (2013.01); *H01L 27/3246* (2013.01); *H01L 27/3248* (2013.01); *H01L 27/3258* (2013.01); *H01L 2227/323* (2013.01)
(58) Field of Classification Search
  CPC ............. H01L 27/3246; H01L 27/3258; H01L 2227/323; H01L 27/3248
  See application file for complete search history.

(56) References Cited

U.S. PATENT DOCUMENTS

| | | | |
|---|---|---|---|
| 10,319,938 B2* | 6/2019 | Choi | ................ H01L 27/124 |
| 2006/0087229 A1 | 4/2006 | Kim | |
| 2014/0133282 A1 | 5/2014 | Hamm | |
| 2015/0028303 A1* | 1/2015 | Kim | ................ H01L 27/3276 |
| | | | 257/40 |
| 2015/0036299 A1 | 2/2015 | Namkung et al. | |
| 2015/0228927 A1* | 8/2015 | Kim | ................ H01L 51/5246 |
| | | | 257/40 |
| 2016/0226026 A1 | 8/2016 | Kwak | |
| 2017/0207253 A1* | 7/2017 | Liu | ................ H01L 27/1222 |
| 2017/0243525 A1* | 8/2017 | Morikawa | ............. H05B 33/04 |
| 2018/0026226 A1 | 1/2018 | Choi et al. | |

FOREIGN PATENT DOCUMENTS

| | | |
|---|---|---|
| KR | 10-2014-0060152 | 5/2014 |
| KR | 10-2018-0015257 | 2/2015 |
| KR | 10-2015-0025260 | 3/2015 |

* cited by examiner

DISPLAY APPARATUS HAVING A LARGER DISPLAY REGION AND MOISTURE IMPERMEABILITY

CROSS-REFERENCE TO RELATED APPLICATION

This application is a Continuation of co-pending U.S. patent application Ser. No. 15/654,265, filed on Jul. 19, 2017 which claims priority to Korean Patent Application No. 10-2016-0091436, filed on Jul. 19, 2016, in the Korean Intellectual Property Office, the disclosures of which are incorporated by reference herein in their entirety.

TECHNICAL FIELD

Exemplary embodiments of the present invention relate to a display apparatus, and more particularly, to a display apparatus having a large display region that is impermeable to external moisture.

DISCUSSION OF THE RELATED ART

An organic light-emitting diode (OLED) display apparatus has a wide viewing angle, a high contrast, and a fast response time. Thus, the OLED display apparatus has attracted attention as a next-generation display apparatus.

Generally, the OLED display apparatus includes thin film transistors and organic light-emitting devices disposed above a substrate. The organic light-emitting devices are capable of emitting light by themselves and so no backlight is needed. The OLED display apparatus may be used as a display panel for a small product such as a mobile phone, or may be used as a display panel for a large product such as a television.

The OLED display apparatus may include a plurality of organic light-emitting devices as a sub-pixels. Each organic light-emitting device includes an intermediate layer with an emission layer disposed between a pixel electrode and an opposite electrode. Since the organic light-emitting device is vulnerable to external moisture, which may permeate therein, an encapsulation layer is disposed above the substrate to cover the organic light-emitting device.

SUMMARY

A display apparatus includes a substrate having a first region and a second region surrounding the first region. An insulating part is disposed above the substrate, covering the first region and the second region, and comprising a first opening portion in the second region. A dam part is disposed above the insulating part in the second region and surrounds a periphery of the first opening portion. A first organic insulating layer is disposed above the insulating part and covers an inner surface of the first opening portion. An organic light-emitting device is disposed above the insulating part in the first region and comprises a pixel electrode. An encapsulation layer is disposed above the insulating part in both the first region and the second region. The encapsulation layer covers the organic light-emitting device.

A display apparatus includes a substrate and an insulating layer disposed on the substrate. The insulating layer has a first opening and a second opening. A thin film transistor (TFT) is disposed within the first opening. An organic film is disposed over the TFT and disposed within the second opening.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
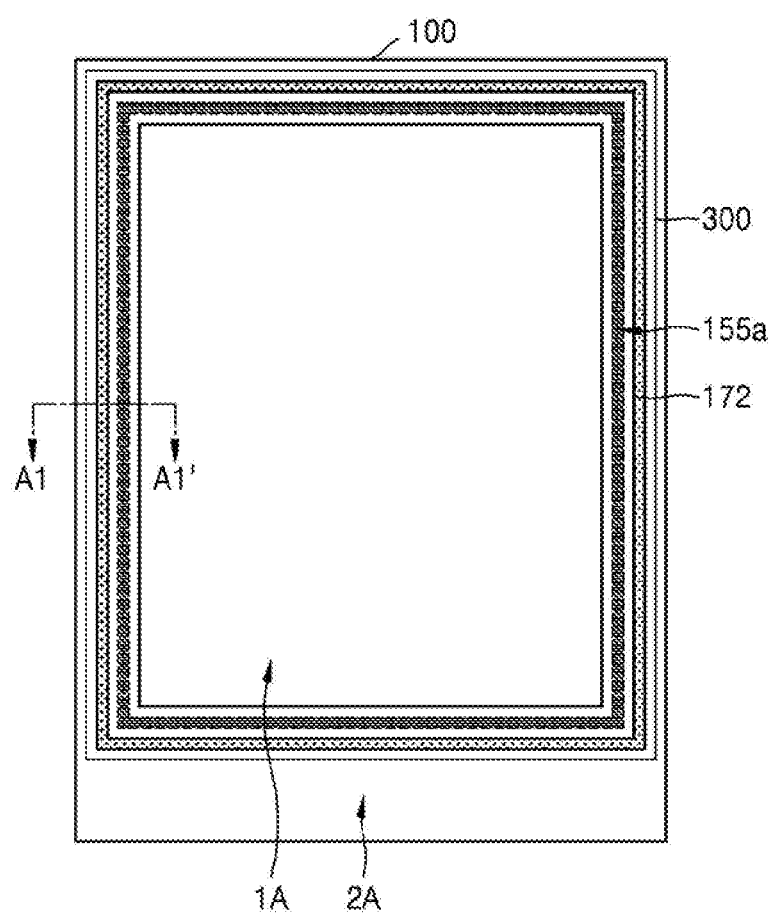
FIG. 1 is a schematic plan view of a display apparatus according to an exemplary embodiment of the present invention.

Reference will now be made in detail to exemplary embodiments of the present invention illustrated in the accompanying drawings, wherein like reference numerals may refer to like elements throughout the specification. In this regard, the embodiments may have different forms and may be modified from the descriptions set forth herein.

Various alterations and modifications may be made to the exemplary embodiments set forth herein, some of which will be illustrated in detail in the drawings and detailed description. The effects and features, and methods of achieving the effects and features will become apparent from the exemplary embodiments described below in detail with reference to the accompanying drawings. However, the inventive concept is not limited to the following embodiments and may be realized in various forms.

It will be understood that although the terms "first", "second", etc. may be used herein to describe various components, these components should not be limited by these terms. These components are only used to distinguish one component from another.

Sizes of elements in the drawings may be exaggerated for convenience of explanation.

Figure 2:
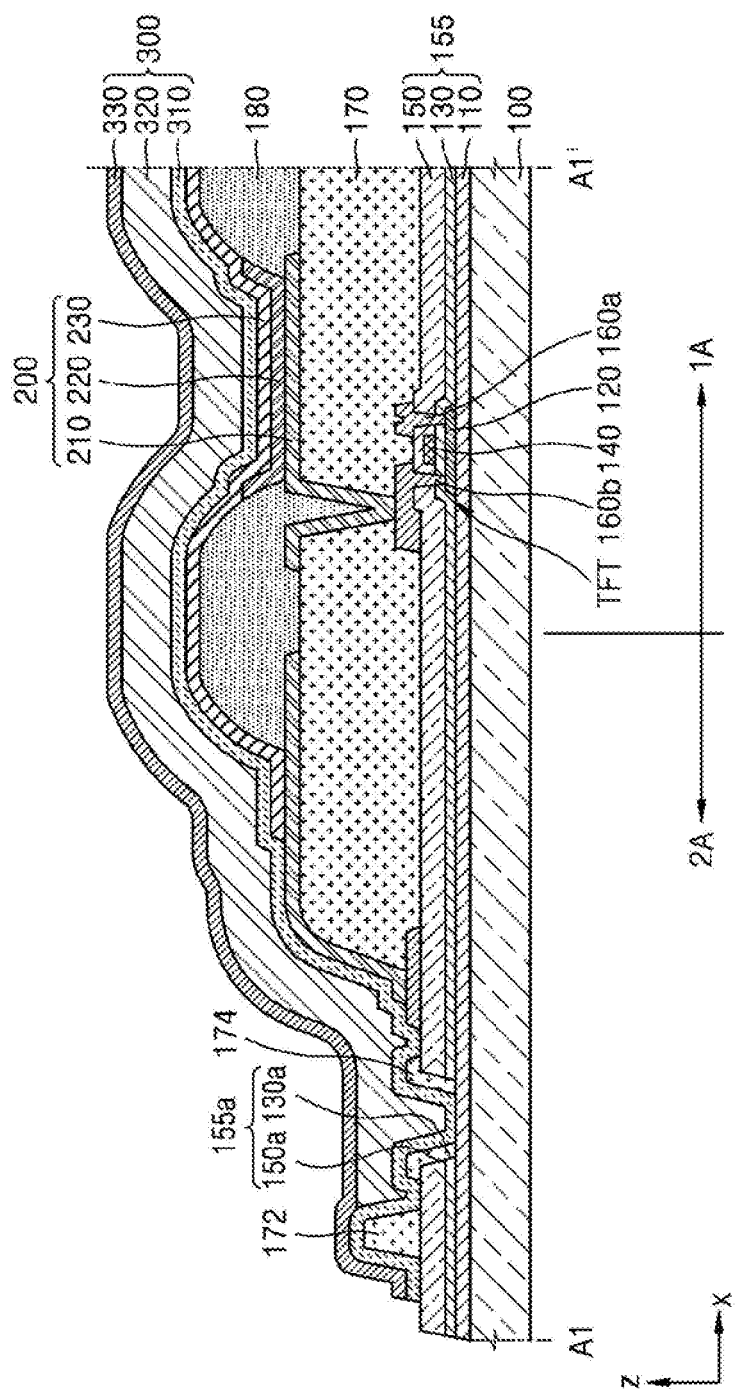
FIG. 2 is a schematic cross-sectional view taken along line A1-A1' of FIG. 1.

FIG. 1 is a schematic plan view of a display apparatus according to an exemplary embodiment of the present invention, and FIG. 2 is a schematic cross-sectional view taken along line A1-A1' of FIG. 1.

Referring to FIGS. 1 and 2, the display apparatus according to an exemplary embodiment of the present invention includes a substrate 100; an insulating part 155 disposed above the substrate 100 and having a first opening portion 155a; a dam part 172 disposed above the insulating part 155 and surrounding the periphery of the first opening portion 155a; a first organic insulating layer 174 covering an inner surface of the first opening portion 155a; an organic light-emitting device 200 disposed above the insulating part 155; and an encapsulation layer 300 covering the organic light-emitting device 200.

The substrate 100 may include various materials, such as glass, a metal material, and/or a plastic material (e.g., polyethylene terephthalate (PET), polyethylene naphthalate (PEN), polyimide, etc.). When the substrate 100 includes a thin glass material or a thin metal material includes a plastic material, the substrate 100 may be flexible. The substrate 100 may have a rectangular shape as illustrated in FIG. 1, and the substrate 100 may have various shapes, such a circular shape or an oval shape, according to a shape of a display.

The substrate 100 may have a first region 1A, and a second region 2A surrounding the periphery of the first region 1A. The first region 1A may be a display region where the organic light-emitting devices 200 are arranged. The second region 2A is a peripheral region of the first region 1A. in the light-emitting devices may be absent from the second region 2A The second region 2A may include wirings and/or circuits. Furthermore, only the substrate 100 or an insulating film above the substrate 100 might be disposed within the second region 2A. Referring to FIG. 1, the first region 1A is illustrated as being disposed in the central portion of the substrate 100 and the second region 2A is illustrated as including edges of the substrate 100 while surrounding the periphery of the first region 1A. However, exemplary embodiments of the present invention are not limited to this particular arrangement.

Referring to FIG. 2, the insulating part 155 may be disposed above the substrate 100, and the insulating part 155 may be disposed over the entire surface of the substrate 100, over both the first region 1A and the second region 2A of the substrate 100. As illustrated in FIG. 2, the insulating part 155 may include a plurality of insulating films. For example, the insulating part 155 may include a buffer layer 110, a first insulating layer 130, and a second insulating layer 150. The first insulating layer 130 may be a gate insulating film that insulates a semiconductor layer 120 and a gate electrode 140 of a thin film transistor TFT in the first region 1A, and the second insulating layer 150 may be an interlayer insulating film that insulates the gate electrode 140 and a source electrode 160a of the thin film transistor TFT or insulates the gate electrode 140 and a drain electrode 160b of the thin film transistor TFT in the first region 1A.

First, the first region 1A of the substrate 100 will be described below.

To planarize the surface of the substrate 100 or to prevent impurities from permeating the semiconductor layer 120 of the thin film transistor TFT, the buffer layer 110 including silicon oxide, silicon nitride, and/or silicon oxynitride may be disposed above the substrate 100 and the semiconductor layer 120 may be disposed above the buffer layer 110. The buffer layer 110 may have a single-layered structure or a multi-layered structure. For example, the buffer layer 110 may have a double-layered structure.

Figure 4:
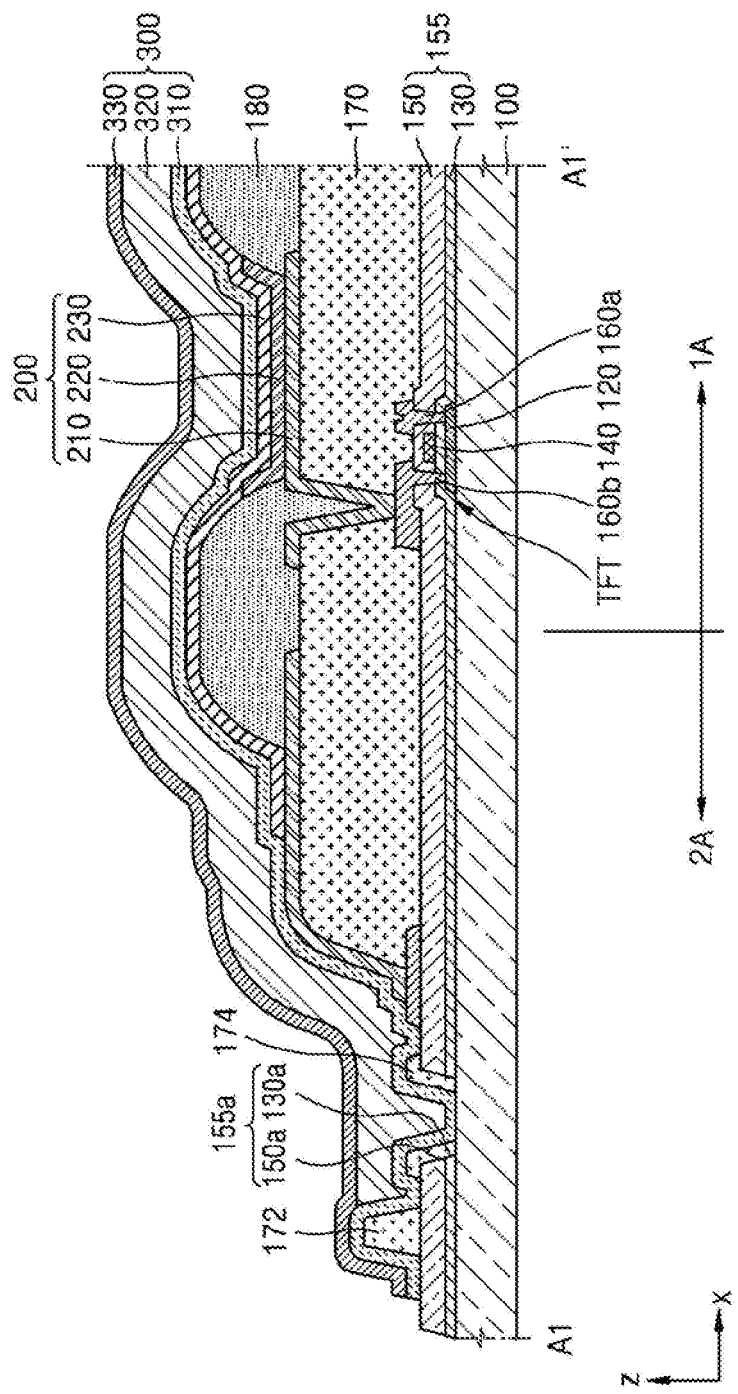
FIG. 4 is a schematic cross-sectional view of a display apparatus according to an exemplary embodiment of the present invention.

However, exemplary embodiments of the present invention are not limited to this particular configuration. According to one or more exemplary embodiments of the present invention, the buffer layer 110 may be omitted, as illustrated in FIG. 4. In this case, the semiconductor layer 120 may directly contact the substrate 100.

The gate electrode 140 is disposed above the semiconductor layer 120, and the source electrode 160a and the drain electrode 160b are electrically connected to each other according to a signal applied to the gate electrode 140. By taking into account adhesion to an adjacent layer, surface flatness of a stacked layer, and processability, the gate electrode 140 may be have a single-layered structure or a multi-layered structure that includes aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu).

To secure insulation properties between the semiconductor layer 120 and the gate electrode 140, the first insulating layer 130 including silicon oxide and/or silicon nitride may be disposed between the semiconductor layer 120 and the gate electrode 140.

The second insulating layer 150 may be disposed above the gate electrode 140. The second insulating layer 150 may have a single-layered structure or a multi-layered structure including silicon oxide or silicon nitride.

The source electrode 160a and the drain electrode 160b may be disposed above the second insulating layer 150. The source electrode 160a and the drain electrode 160b may be electrically connected to the semiconductor layer 120 through contact holes formed in the second insulating layer 150 and the first insulating layer 130. By taking into account conductivity or the like, the source electrode 160a and the drain electrode 160b may have a single-layered structure or a multi-layered structure including Al, Pt, Pd, Ag, Mg, Au, Ni, Nd, Ir, Cr, Li, Ca, Mo, Ti, W, and/or Cu.

The thin film transistor TFT may have the above-described structure and a protection film may be disposed to cover the thin film transistor. The protection film may include an inorganic material, such as silicon oxide, silicon nitride, or silicon oxynitride.

A via layer 170 may be disposed above the substrate 100. In this case, the via layer 170 may be a planarization film or a protection film. In a case where the organic light-emitting device 200 is disposed above the thin film transistor TFT, the via layer 170 may planarize the top surface of the thin film transistor TFT and protect the thin film transistor TFT and other devices. The via layer 170 may include an acryl-based organic material and/or benzocyclobutene (BCB).

A pixel defining film 180 may be disposed above the thin film transistor TFT. The pixel defining film 180 may be disposed above the via layer 170 and may have an opening defining a pixel region. The pixel defining film 180 may serve to define a pixel region of each pixel through the opening.

The pixel defining film 180 may include, for example, an organic insulating film. The organic insulating film may include an acryl-based polymer such as polymethyl methacrylate (PMMA), a polystyrene (PS), a polymer derivative having a phenol group, an imide-based polymer, an arylether-based polymer, an amide-based polymer, a fluorine-based polymer, a p-xylene-based polymer, a vinylalcohol-based polymer, and/or any mixtures thereof.

An organic light-emitting device 200 may be disposed above the via layer 170. The organic light-emitting device 200 may include a pixel electrode 210, an intermediate layer 220 including, an emission layer (EML), and an opposite electrode 230.

The pixel electrode 210 may be a transparent (or translucent) electrode or a reflective electrode. When the pixel electrode 210 is the transparent (or translucent) electrode, the pixel electrode 210 may include indium thin oxide (ITO), indium zinc oxide (IZO), zinc oxide (ZnO), indium oxide ($In_2O_3$), indium gallium oxide (IGO), and/or aluminum zinc oxide (AZO). When the pixel electrode 210 is the r Elective electrode, the pixel electrode 210 may include a reflection film including Ag, Mg, Al, Pt, Pd, Au, Ni, Nd, Ir, Cr, and/or any compounds thereof and a layer including ITO, EZO, ZnO, $In_2O_3$, IGO, and/or AZO. However, exemplary embodiments of the present invention are not limited to this particular composition. The pixel electrode 210 may include various materials. Various modifications may be made to the pixel electrode 210. For example, the pixel electrode 210 may have a single-layered structure or a multi-layered structure.

The intermediate layer 220 may be disposed within the pixel region defined by the pixel defining film 180. The intermediate layer 220 may include an emission layer (EML) that emits light according to an electrical signal. The intermediate layer 220 may have a single-layered structure or a multi-layered structure including, in addition to the EML, a hole injection layer (HIL) and a hole transport layer (HTL), which are disposed between the EML and the pixel electrode 210. The intermediate layer 220 may further include an electron transport layer (ETL) and an electron injection layer (EIL), which are disposed between the EML and the opposite electrode 230. However, the intermediate layer 220 is not limited to this particular configuration. The intermediate layer 220 may have various structures.

The opposite electrode 230, which covers the intermediate layer 220 including the EML and faces the pixel electrode 210, may be disposed over the entire surface of the substrate 100. The opposite electrode 230 may be a transparent (or translucent) electrode or a reflective electrode.

The intermediate layer 220 may include a low-molecular-weight organic material or a high-molecular-weight organic material.

When the intermediate layer 220 includes a low-molecular-weight organic material, an HTL, an HIL, an ETL, and an EIL may be stacked with respect to an EML. When necessary, various layers may be further stacked. In this case examples of available organic materials may include copper phthalocyanine (CuPc), N'-di(naphthalene-1-yl)-N, N'-diphenyl-benzidine (NPB), and tris-8-hydroxyquinoline aluminum ($Alq_3$).

When the intermediate layer 220 includes a high-molecular-weight organic material, the intermediate layer 220 may further include an HTL. The HTL may include poly-(2,4)-ethylene-dihydroxy thiophene (PEDOT) or polyaniline (PANI). In this case, examples of available organic materials may include a high-molecular-weight organic material that includes poly-phenylenevinylene (PPV) or polyfluorene. Also, an inorganic material may be disposed between the intermediate layer 220 and the pixel electrode 210 and between the intermediate layer 220 and the opposite electrode 230.

In this case, the HTL, the HIL, the ETL, and the EIL may be integrally formed above the entire surface of the substrate 100, and only the EML may be formed at each pixel. The EML may be formed by an inkjet printing process. The HTL, the HIL, the ETL, and the EIL may be it a lead-in portion.

When the opposite electrode 230 is a transparent (or translucent) electrode, the opposite electrode 230 may include a layer including a metal having a small work function, for example, Li, Ca, LiF/Ca, LiF/Al, Al, Ag, Mg, and any compounds thereof, and a transparent (or translucent) conductive layer including ITO, IZO, ZnO, or $In_2O_3$. When the opposite electrode 230 is a reflective electrode, the opposite electrode 230 may include a layer including Li, Ca, LiF/Ca, LiF/Al, Al, Ag, Mu, and any compounds thereof. The structure and material of the opposite electrode 230 are not limited thereto, and various modifications may be made thereto.

The encapsulation layer 300 may be disposed above the organic light-emitting device 200 to cover the organic light-emitting device 200. Although not illustrated, in one or more exemplary embodiments of the present invention, functional layers, such as a polarization layer, may be further disposed between the opposite electrode 230 and the encapsulation layer 300.

The encapsulation layer 300 may include a first inorganic film 310, a second inorganic film 330, and an organic film 320 disposed between the first, inorganic film 310 and the second inorganic film 330. The encapsulation layer 300 may serve to seal the organic light-emitting device 200 that is vulnerable external moisture permeation. The encapsulation layer 300 may have a multi-layered structure in which the inorganic film and the organic film 320 are alternately stacked, so as to increase sealing performance. Also, the organic film 320 of the encapsulation layer 300 may be thicker than the first inorganic film 310 and the second inorganic film 330.

The first inorganic film 310 and the second inorganic film 330 may be disposed above the entire surface of the substrate 100 in the first region 1A and the second region 2A. The first inorganic film 310 and the second inorganic film 330 may include, for example, silicon nitride, aluminum nitride, zirconium nitride, titanium nitride, hafnium nitride, tantalum nitride, silicon oxide, aluminum oxide, titanium oxide, tin oxide, cerium oxide, and/or silicon oxynitride (SiON). In this case, the material of the first inorganic film 310 may be identical to or different from the material of the second inorganic film 330.

The organic film 320 may be disposed between the first inorganic film 310 and the second inorganic film 330, so as to increase flexibility of the encapsulation layer 300. The organic film 320 may be sealed by the first inorganic film 310 and the second inorganic film 330. For example, the side of the organic film 320 may be covered by the first inorganic film 310 and the second inorganic film 330. For example, the organic film 320 may be completely covered by the second inorganic film 330 above the organic film 320. Edges of the first inorganic film 310 and the second inorganic film 330 covering the side of the organic film 320 may directly contact each other. Since the organic film 320 is a passage by which external moisture may permeate, the organic film 320 is completely sealed by the first inorganic film 310 and the second inorganic film 330. The organic film 320 may include, for example, an acryl-based resin, a methacryl-based resin, a polyisoprene-based resin, a vinyl-based resin, an epoxy-based resin, a urethane-based resin, a cellulose-based resin, and/or a perylene-based resin. The material of the first organic film may be identical to or different from the material of the second organic film.

Next, the second region 2A of the substrate 100 will be described with reference to FIG. 2.

The second region 2A of the substrate 100 may be a region that surrounds the periphery of the first region 1A and includes the edges of the substrate 100. Wirings, circuits, and the like, except for the organic light-emitting device 200, may be arranged in the second region 2A. Furthermore, only the substrate 100 or an insulating film above the substrate 100 may be disposed in the second region 2A. According to an exemplary embodiment of the present invention, the insulating part 155 may be disposed over the first region 1A and the second region 2A of the substrate 100. A portion of the via layer in the first region 1A may extend to the second region 2A. Also, a portion of the encapsulation layer 300 in the first region 1A may extend to the second region 2A.

The insulating part 155 in the second region 2A may have a first opening portion 155a disposed around an edge of the first region 1A. For example, the first opening portion 155a may be disposed in the second region 2A around the first region 1A. The first opening portion 155a may have a closed loop along the first region 1A, or may have an opened loop. As illustrated in FIG. 2 the first opening portion 155a may expose at least a portion of the buffer layer.

The first opening portion 155a may include a first opening 130a and a second opening 150a corresponding to the first opening portion 155a. For example, the insulating part 155 may include the buffer layer 110, and the first insulating layer 130 and the second insulating layer 150 above the buffer layer 110. The first insulating layer 130 may have the first opening 130a corresponding to the first opening portion 155a. Similarly, the second insulating layer 150 may have the second opening 150a corresponding to the first opening portion 155a. An inner surface of the first opening 130a is illustrated in FIG. 2 as matching an inner surface of the second opening 150a, but a cross-section of the first opening 130a may or might not match a cross-section of the second opening 150a. For example, in a case where the first insulating layer 130 and the second insulating layer 150 include the same inorganic material, the inner surfaces of the first insulating layer 130 and the second insulating layer 150 may match each other through etching using the same mask. However, in a case where the first insulating layer 130 and the second insulating layer 150 include different inorganic materials, the inner surfaces of the first insulating layer 130 and the second insulating layer 150 might not match each other through etching using the same mask. In a case where the inner surfaces of the first insulating layer 130 and the second insulating layer 150 do not match each other, the first inorganic film 310 of the encapsulation layer 300 extending to the second region 2A might not easily cover the inner surface of the first opening portion 155a. In a case where the first inorganic film 310 does not easily cover the inner surface of the first opening portion 155a, external moisture may permeate the display apparatus through the region where the first inorganic film 310 is discontinuously formed. Thus, it is possible to increase step coverage of the first inorganic film 310 by covering the inner surface of the first opening portion 155a by using the first organic insulating layer 174.

Figure 3:
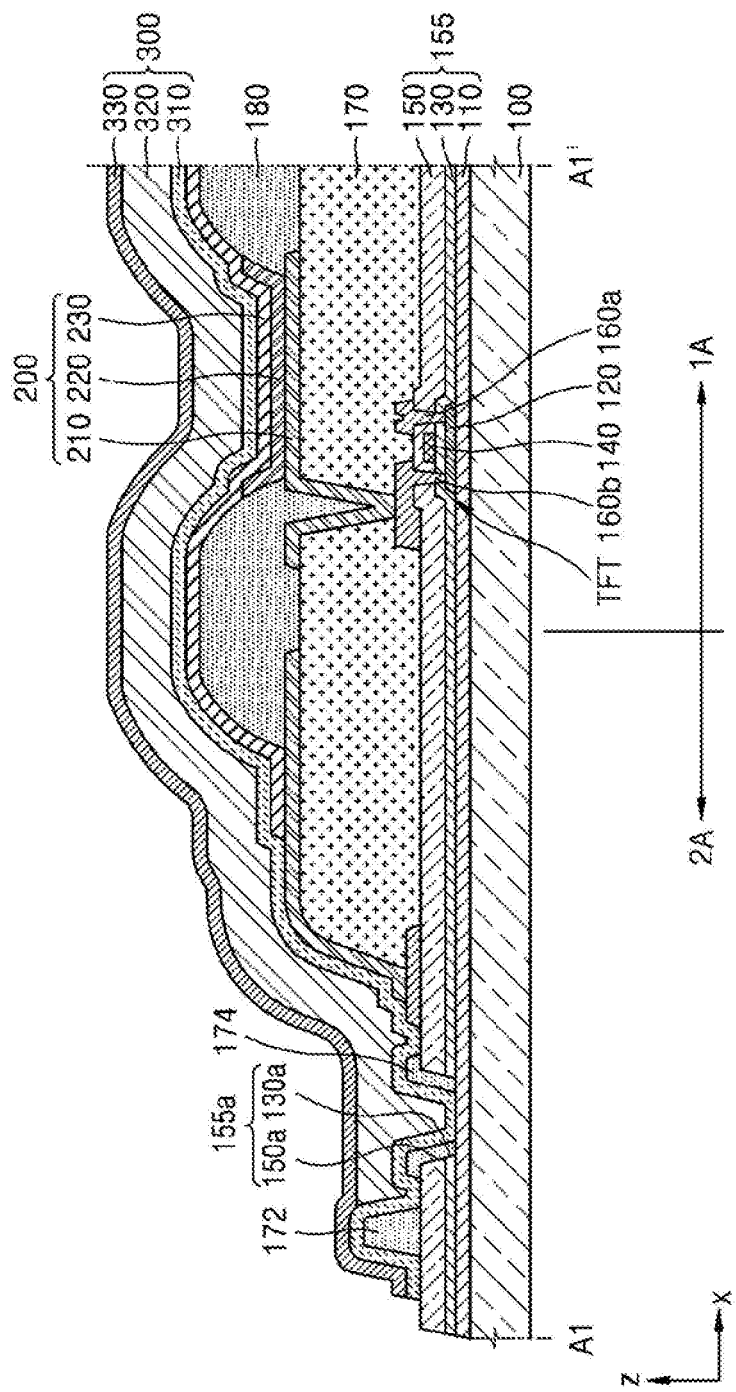
FIG. 3 is a schematic cross-sectional view of a display apparatus according to an exemplary embodiment of the present invention.

The first organic insulating layer 174 covering the inner surface of the first opening portion 155a may be disposed above the insulating part 155 in the first opening portion 155a. As illustrated in FIG. 2, the first organic insulating layer 174 may cover the inner surface of the first opening portion 155a, and may cover at least a portion of the top surface of the insulating part 155 where the first opening portion 155a is disposed. The first organic insulating layer 174 may cover the inner surface of the first opening portion 155a and expose at least a portion of the buffer layer 110. The first organic insulating layer 174 and the via layer 170 may include the same material. As illustrated in FIG. 3, the first organic insulating layer 174 and the pixel defining film 180 may include the same material.

The dam part 172 may be disposed above the insulating part 155 in the second region 2A to surround the periphery of the first opening portion 155a. As in the first opening portion 155a, the dam part 172 may have a closed loop or may have an opened loop. The dam part 172 may serve to prevent the organic film 320 of the encapsulation layer 300 from overflowing to the edges of the substrate 100 and may allow the organic film 320 to be easily sealed by the first inorganic film 310 and the second inorganic film 330.

The dam part 172 and the via layer 170 may include the same material. As illustrated in FIG. 3, the dam part 172 and the pixel defining film 180 may include the same material. When the dam part 172 and the via layer 170 include the same material, a height of the dam part 172 may be equal to or less than a height of the via layer 170. In one or more exemplary embodiments of the present invention, when the dam part 172 and the pixel defining film 180 include the same material, a height of the dam part 172 may be equal to or less than a height of the pixel defining film 180. When the height of the dam part 172 is less than the height of the dam part 172 or the via layer 170, the height of the dam part 172 may be adjusted by using a halftone mask or the like during a manufacturing process. The dam part 172 is formed to have a single-layered structure, but in other embodiments, the dam part 172 may have a multi-layered structure. In this case, the dam part 172 may have a multi-layered structure including a layer including the same material as that of the via layer 170 and a layer including the same material as that of the pixel defining film 180.

As described above, the encapsulation layer 300 may extend from the first region 1A to the second region 2A above the insulating part 155 in the second region 2A. As illustrated in FIG. 2, the first inorganic film 310 may be disposed above the opposite electrode in the first region 1A, may extend to the second region 2A, and may be disposed above the first opening portion 155a, the first organic insulating layer 174 covering the inner surface of the first opening portion 155a, and the dam part 172. The first inorganic film 310 may cover the entire surface of the substrate 100 and may extend to the edges of the substrate 100.

The organic film 320 may be disposed above the first inorganic film 310 and may be disposed in a portion of the first region 1A and the second region 2A. In this case, the expression that "the organic film 320 is in a portion of the second region 2A" may denote that the organic film 320 is arranged up to the dam part 172 and disposed in the second region 2A. For example, the overflow of the organic film 320 is prevented by the dam part 172, and thus, the organic film 320 is not formed up to the edges of the substrate 100. The organic film 320 may be buried in the first opening portion 155a formed in the insulating part 155. The top surface of the organic film 320 buried in the first opening portion 155a may have an approximately flat shape.

The second inorganic film 330 may be disposed above the organic film 320. The second inorganic film 330 may be disposed above the organic film 320 and may come into direct surface contact with the organic film 320 in the region where the organic film 320 is formed. As described above, since the region of the organic film 320 is defined by the dam part 172 of the second region 2A, the second inorganic film 330 may directly contact the organic film 320 until just before the dam part 172, and comes into direct surface contact with the first inorganic film 310 from the top surface of the dam part 172 to the edge of the substrate 100. For example, the organic film 320 is not present from the top surface of the dam part 172 to the edge of the substrate 100, and the first inorganic film 310 extends to the edge of the first inorganic film 310.

In the related art, the second region 2A has more than a certain width to prevent damage to the display apparatus due to external moisture permeation. For example, in the encapsulation layer 300 playing a major role in preventing external moisture permeation, the region where the first inorganic film 310 and the second inorganic film 330 come into direct contact with each other may have more than a certain width. However, in this case, as the width of the second region 2A is increased in the periphery of the first region 1A, except for the first region 1A where pixels are arranged, a non-display region of the display apparatus, e.g., a dead space, is expanded.

Since the insulating part 155 in the second region 2A has the first opening portion 155a and the organic film 320 is partially buried in the first opening portion 155a, a passage of external moisture permeability through the side of the insulating film is blocked to thereby make a display apparatus robust to moisture permeation. Due to the first organic insulating layer 174 covering the inner surface of the first opening portion 155a, step coverage of the first inorganic film 310 may be increased. Also, due to the first opening portion 155a blocking the passage of moisture permeability, the non-display region of the display apparatus, for example, the dead space, may be reduced.

Figure 5:
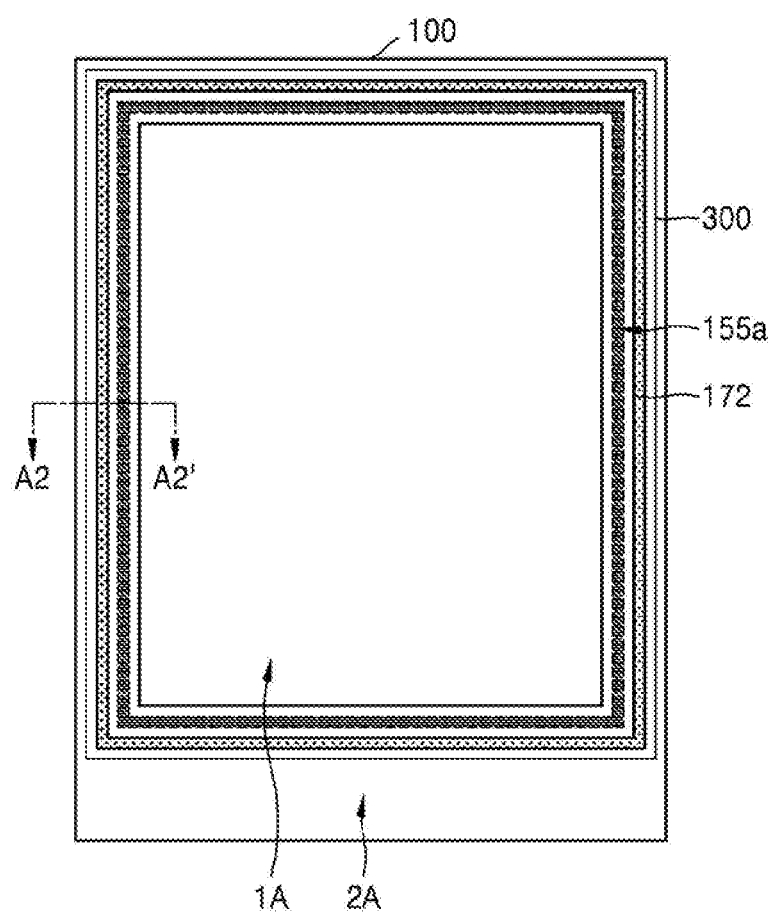
FIG. 5 is a schematic plan view of a display apparatus according to an exemplary embodiment of the present invention.
Figure 6:
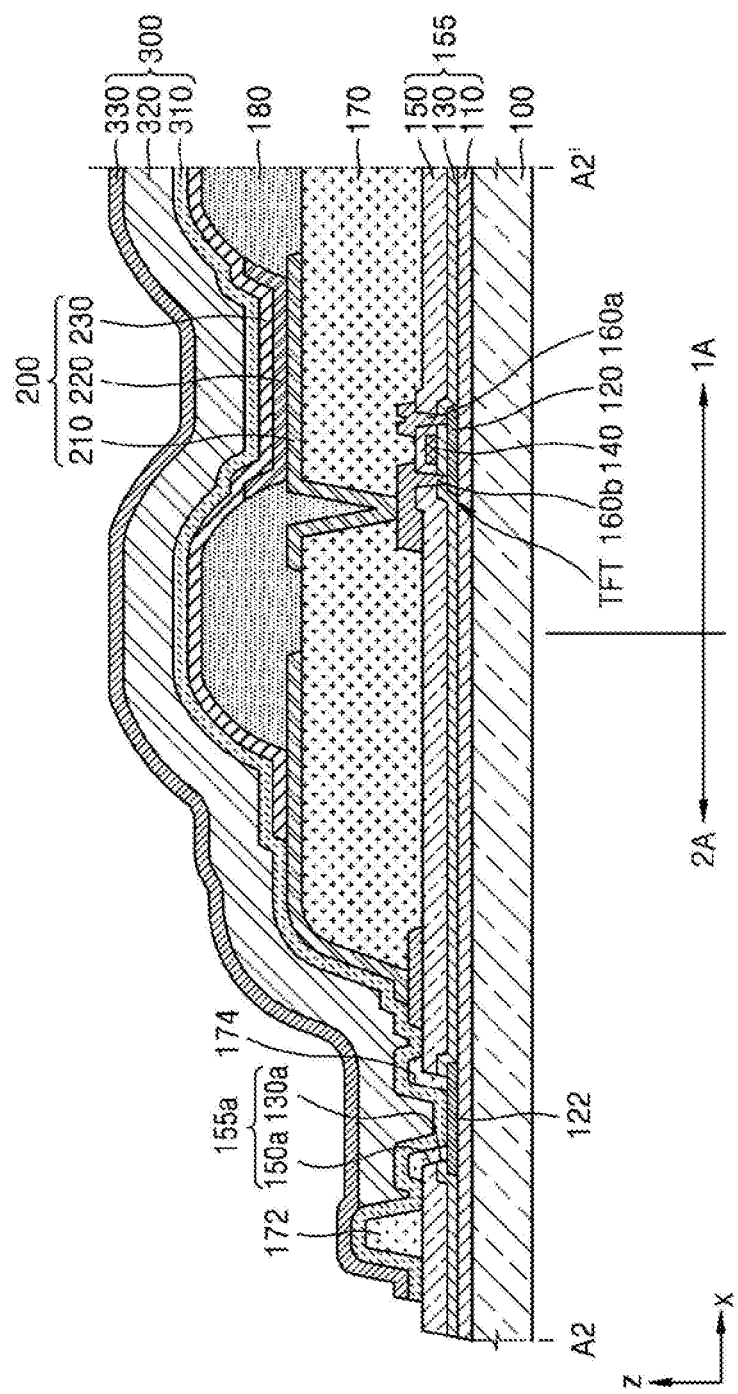
FIG. 6 is a schematic cross-sectional view taken along line A2-A2' of FIG. 5.

FIG. 5 is a schematic plan view of a display apparatus according to an exemplary embodiment of the present invention, and FIG. 6 is a schematic cross-sectional view taken along line A2-A2' of FIG. 5.

Referring to FIGS. 5 and 6, the display apparatus according to an exemplary embodiment of the present invention includes a substrate 100; an insulating part 155 above the substrate 100 having a first opening portion 155a; a dam part 172 disposed above the insulating part 155 and surrounding the periphery of the first opening portion 155a; an organic insulating layer 174 covering an inner surface of the first opening portion 155a; an organic light-emitting device 200 disposed above the insulating part 155; an encapsulation layer 300 covering the organic light-emitting device 200; and a first material layer 122 disposed between the substrate 100 and the insulating part 155.

The approach illustrated in FIG. 6 is substantially identical to the approach illustrated in FIG. 2, except that according to the approach illustrated in FIG. 6, the first material layer 122 is disposed in a region where the first opening portion 155a is disposed.

Referring to FIG. 6, the first material layer 122 may be disposed between the substrate 100 and the insulating part 155 of the second region 2A. For example, the first material layer 122 may be disposed above the buffer layer and may be disposed between the buffer layer and the first insulating layer 130. The first opening portion 155a may be formed to expose at least a portion of the first material layer 122. The first material layer 122 may include the same material as that of a semiconductor layer 120 of a thin film transistor TFT, but might not undergo a doping process as is performed in the semiconductor layer 120.

In the manufacturing process of forming the first opening portion 155a, when the first opening portion 155a is formed through etching, the first material layer 122 may serve as an etch stopper to adjust a depth to be defined by the first opening portion 155a. As such, the depth of the first opening portion 155a may be controlled according to which layer the first material layer 122 is arranged on.

As described above, since the first opening portion 155a is formed to expose at least a portion of the first material layer 122, the first organic insulating layer 174 covering the inner surface of the first opening portion 155a may expose at least a portion of the first material layer 122. In this case, at least a portion of the first organic insulating layer 174 may directly contact with the first material layer 122. Therefore, the region where the first organic insulating layer 174 exposes the first material layer 122 may be smaller than the region where the first opening portion 155a exposes the first material layer 122.

The first inorganic film 310 of the encapsulation layer 300 may be disposed above the insulating part 155 so as to cover the first organic insulating layer 174, and may come into direct contact with the first material layer 122, at least a portion of which is exposed by the first opening portion 155a and the first organic insulating layer 174.

According to an exemplary embodiment of the present invention, since the insulating part 155 in the second region 2A has the first opening portion 155a and the organic film 320 is partially buried in the first opening portion 155a, a passage of external moisture permeability through the side of the insulating film is blocked to thereby provide a display apparatus robust to moisture permeation. Due to the first organic insulating layer 174 covering the inner surface of the first opening portion 155a, it is possible to increase step coverage of the first inorganic film 310. Also, due to the first opening portion 155a blocking the passage of moisture permeability, it is possible to reduce the width of the non-display region of the display apparatus, that is, for example, the dead space.

Figure 7:
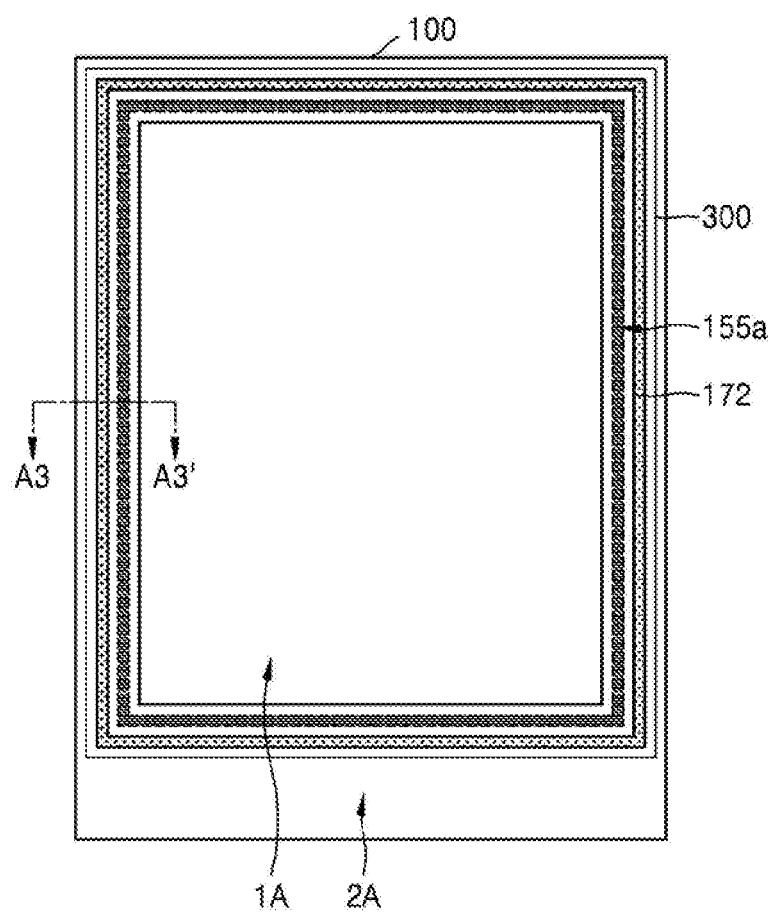
FIG. 7 is a schematic plan view of a display apparatus according to an exemplary embodiment of the present invention.
Figure 8:
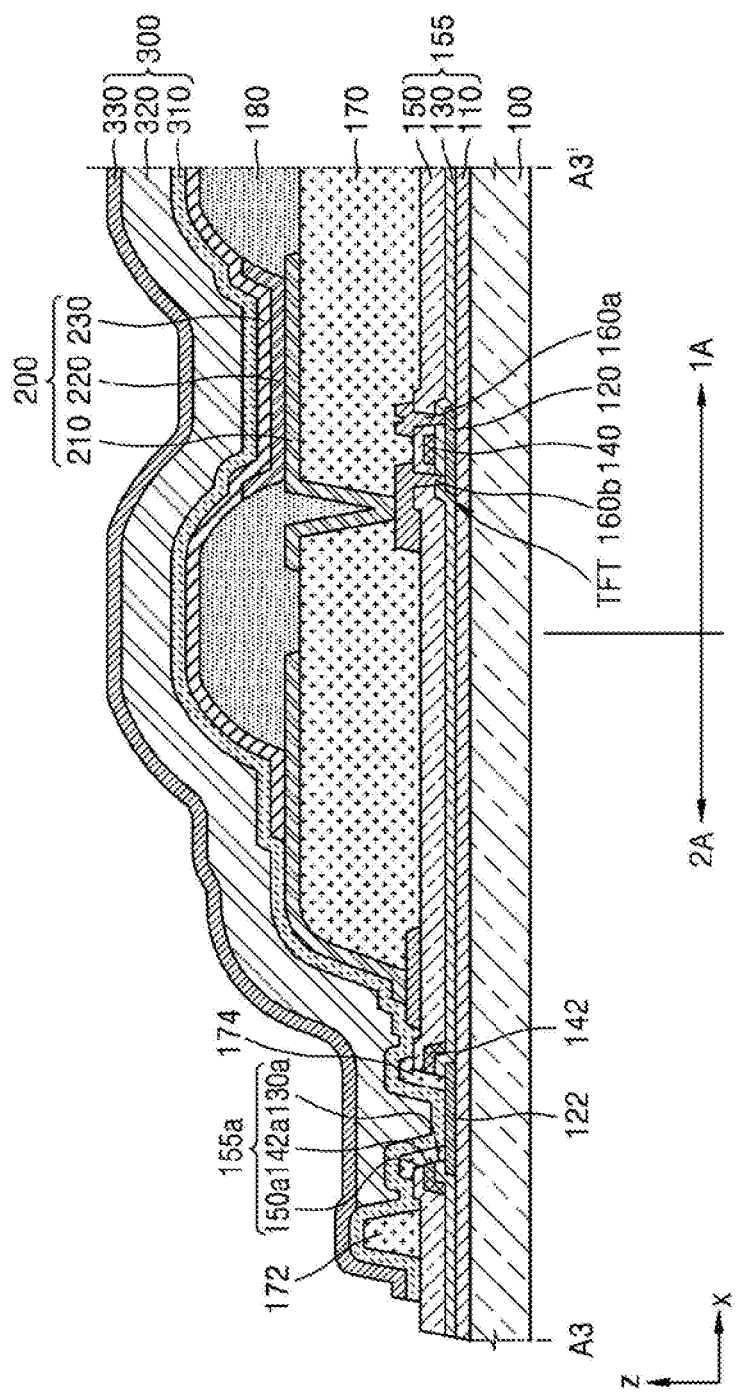
FIG. 8 is a schematic cross-sectional view taken along line A3-A3' of FIG. 7.

FIG. 7 is a schematic plan view of a display apparatus according to an exemplary embodiment of the present invention, and FIG. 8 is a schematic cross-sectional view taken along line A3-A3' of FIG. 7.

Referring to FIGS. 7 and 8, the display apparatus according to an exemplary embodiment of the present invention includes a substrate 100; an insulating part 155 disposed above the substrate 100 and having a first opening portion 155a; a dam part 172 disposed above the insulating part 155 and surrounding the periphery of the first opening portion 155a; an organic insulating layer 174 covering an inner surface of the first opening portion 155a; an organic light-emitting device 200 disposed above the insulating part 155; an encapsulation layer 300 covering the organic light-emitting device 200; a first material layer 122 disposed between the substrate 100 and the insulating part 155; and a first metal layer 142.

The approach illustrated in FIG. 8 is substantially identical to the approach lustrated in FIGS. 2 and 6, except that, according to the approach illustrated in FIG. 8, the first metal layer 142 is disposed between the first insulating layer 130 and the second insulating layer 150.

Referring to FIG. 8, the insulating part 155 disposed above the substrate 100 may include a buffer layer 110, a first insulating layer 130, and a second insulating layer 150. As described above, the first insulating layer 130 may have a first opening 130a corresponding to the first opening portion 155a, and the second insulating layer 150 may have a second opening 150a corresponding to the first opening portion 155a. According to an exemplary embodiment of the present invention, the first metal layer 142 may be further provided between the first insulating layer 130 and the second insulating layer 150. Like the first opening 130a of the first insulating layer 130 and the second opening 150a of the second insulating layer 150, the first metal layer 142 may have a third opening 142a corresponding to the first opening portion 155a. The first opening 130a, the second opening 150a, and the third opening 142a are illustrated in FIG. 7 as having the same inner surface, but the first opening 130a, the second opening 150a, and the third opening 142a might not have the same inner surface. For example, the first opening 130a, the second opening 150a, and the third opening 142a may have different sizes. In this case, the first opening 130a, the second opening 150a, and the third opening 142a may have different inner surfaces.

As such, the first metal layer 142 may include the same material as that of a gate electrode 140 of a thin film transistor TFT in the first region 1A, but the exact composition of the first metal layer 142 is not limited thereto.

The first organic insulating layer 174 may cover the inner surface of the first opening portion 155a including the first opening 130a, the second opening 150a, and the third opening 142a. As described above, even when the first opening 130a, the second opening 150a, and the third opening 142a have different inner surfaces, the first organic insulating layer 174 covers the entire inner surface of the first opening portion 155a, thereby preventing a discontinuous formation of the first inorganic film 310 covering the first opening portion 155a.

Due to the first metal layer 142 having the third opening 142a corresponding to the first opening portion 155a, a depth of the first opening portion 155a may be increased as much as a thickness of the first metal layer 142. As the depth of the first opening portion 155a is increased, an area of the first inorganic film 310 covering the first opening portion 155a may be increased and the depth of the organic film 320 buried in the first opening portion 155a may be increased. Thus, it is more effective to the blocking of the permeation of external moisture.

According to an exemplary embodiment of the present invention, since the insulating part 155 in the second region 2A has the first opening portion 155a and the organic film 320 is partially buried in the first opening portion 155a, a passage of external moisture permeability through the side of the insulating film is blocked to thereby provide a display apparatus robust to moisture permeation. Due to the first organic insulating layer 174 covering the inner surface of the first opening portion 155a, step coverage of the first inorganic film 310 may be increased. Also, due to the first opening portion 155a blocking the permeation of moisture, the width of the non-display region of the display apparatus, for example, the dead space, may be narrowed.

Figure 9:
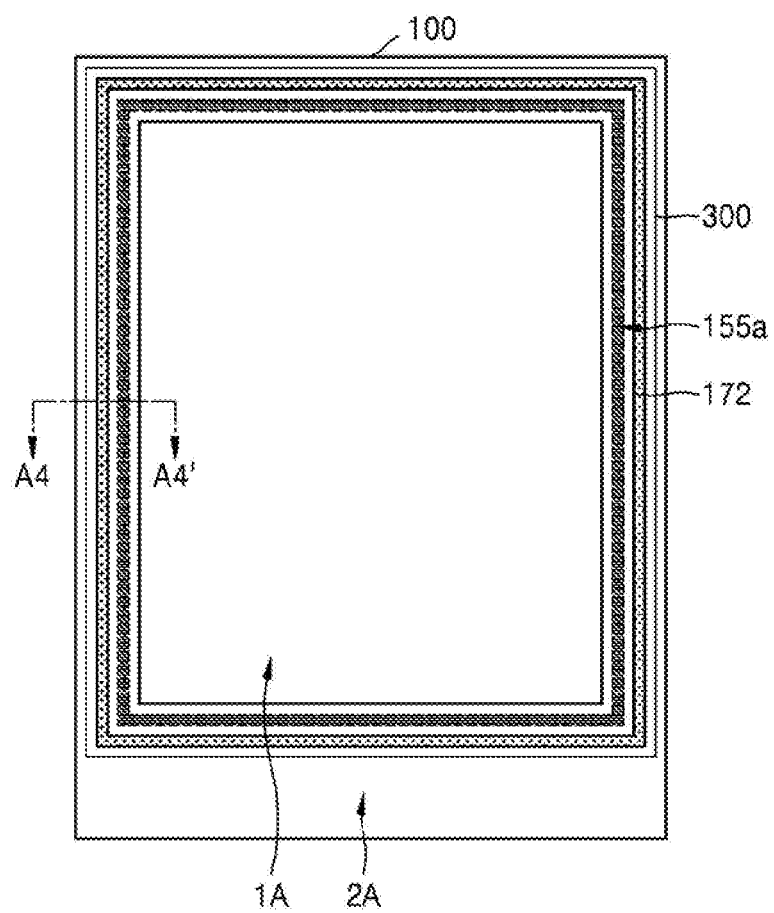
FIG. 9 is a schematic plan view of a display apparatus according to an exemplary embodiment of the present invention.
Figure 10:
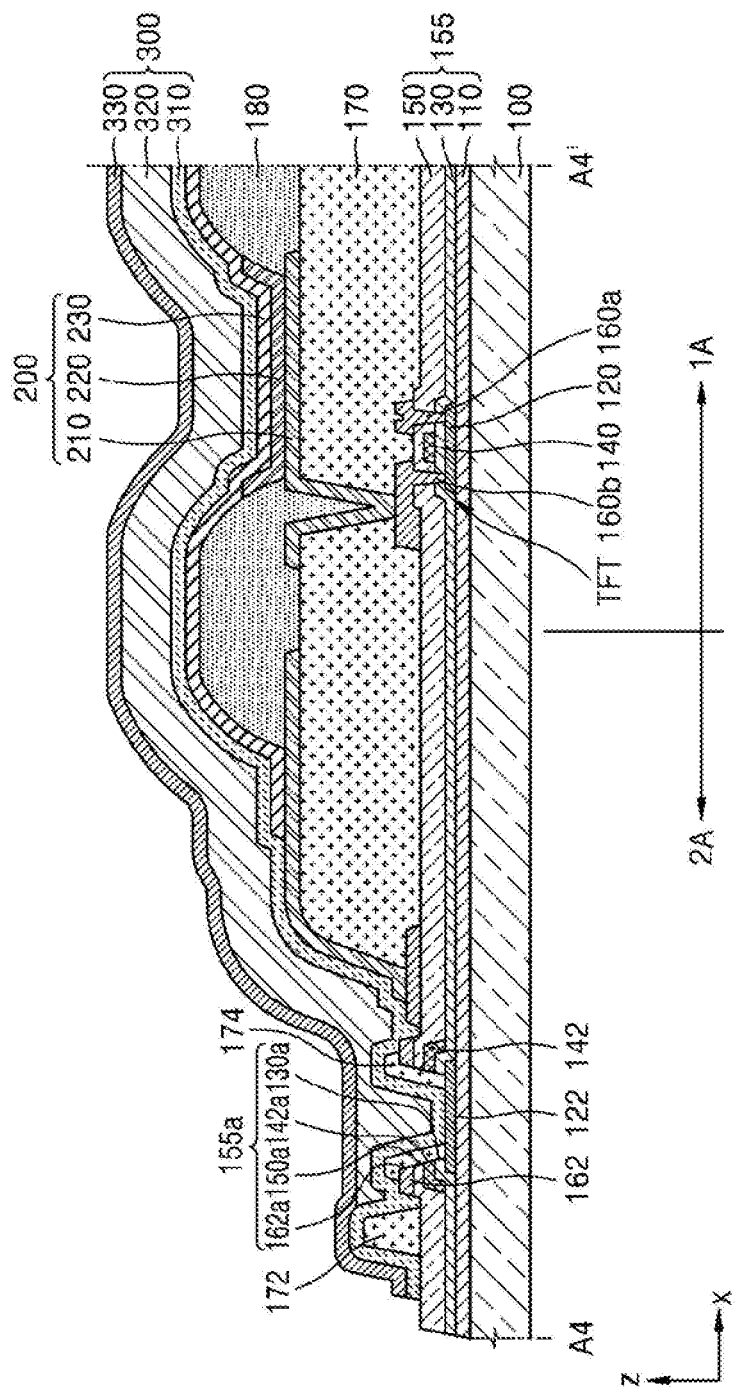
FIG. 10 is a schematic cross-sectional view taken along line A4-A4' of FIG. 9.

FIG. 9 is a schematic plan view of a display apparatus according to an exemplary embodiment of the present invention, and FIG. 10 is a schematic cross-sectional view taken along line A4-A4' of FIG. 9.

Referring to FIGS. 9 and 10, the display apparatus according to an exemplary embodiment of the present invention includes a substrate 100; an insulating part 155 disposed above the substrate 100 and having a first opening portion 155a; a dam part 172 disposed above the insulating part 155 and surrounding the periphery of the first opening portion 155a; an organic insulating layer 174 covering an inner surface of the first opening portion 155a; an organic light-emitting device 200 disposed above the insulating part 155; an encapsulation layer 300 covering the organic light-emitting device 200; a first material layer 122 disposed between the substrate 100 and the insulating part 155; and a second metal layer 162.

The approach illustrated in FIG. 10 is substantially identical to the approach illustrated in FIGS. 2 and 8, except that the second metal layer 162 is disposed on the top surface of the insulating part 155 having the first opening portion 155a.

Referring to FIG. 10, the insulating part 155 above the substrate 100 may include a buffer layer 110, a first insulating layer 130, and a second insulating layer 150. As described above, the first insulating layer 130 may have a first opening 130a corresponding to the first opening portion 155a. The second insulating layer 150 may have a second opening 150a corresponding to the first opening portion 155a. According to an exemplary embodiment of the present invention, the display apparatus may further include the first metal layer 142 disposed between the first insulating layer 130 and the second insulating layer 150, and the second metal layer 162 disposed above the second insulating layer 150.

Like the first opening 130a of the first insulating layer 130 and the second opening 150a of the second insulating layer 150, the first metal layer 142 may have a third opening 142a corresponding to the first opening portion 155a. Also, the second metal layer 162 may have a fourth opening 162a corresponding to the first opening portion 155a. The first opening 130a, the second opening 150a, the third opening 142a, and the fourth opening 162a are illustrated in FIG. 9 as having the same inner surface, but the first opening 130a, the second opening 150a, the third opening 142a, and the fourth opening 162a might not have the same inner surface. For example, the first opening 130a, the second opening 150a, the third opening 142a, and the fourth opening 162a may have different sizes. In this case, the first opening 130a, the second opening 150a, the third opening 142a, and the fourth opening 162a may have different inner surfaces.

As such, the first metal layer 142 may include the same material as that of a gate electrode 140 of a thin film transistor TFT in the first region 1A, but the composition of the first metal layer 142 is not limited thereto. Also, the second metal layer 162 may include the same material as that of a source electrode 160a or a drain electrode 160b of the thin film transistor TFT.

The first organic insulating layer 174 may cover the inner surface of the first opening portion 155a further including the third opening 142a and the fourth opening 162a. As described above, even when the first opening 130a, the second opening 150a, the third opening 142a, and the fourth opening 162a have different inner surfaces, the first organic insulating layer 174 covers the entire inner surface of the first opening portion 155a, thereby preventing a discontinuous formation of the first inorganic film 310 covering the first opening portion 155a.

Due to the first metal layer 142 having the third opening 142a corresponding to the first opening portion 155a and the second metal layer 162 having the fourth opening 162a corresponding to the first opening portion 155a, a depth of the first opening portion 155a may be increased by as much as a thickness of the first metal layer 142 and the second metal layer 162. As the depth of the first opening portion 155a is increased, an area of the first inorganic film 310 covering the first opening portion 155a may be increased and the depth of the organic film 320 buried in the first opening portion 155a may be increased. Thus the blocking of the passage of external moisture permeation may be increased.

According to an exemplary embodiment of the present invention, since the insulating pan 155 in the second region 2A has the first opening portion 155a and the organic film 320 is partially buried in the first opening portion 155a, a passage of external moisture permeation through the side of the insulating film is blocked to thereby provide a display apparatus robust to moisture permeation. Due to the first organic insulating layer 174 covering the inner surface of the first opening portion 155a, it is possible to increase step coverage of the first inorganic film 310. Also, due to the first opening portion 155a blocking the permeation of moisture, it is possible to narrow the width of the non-display region of the display apparatus, which may be regarded as dead space.

Figure 11:
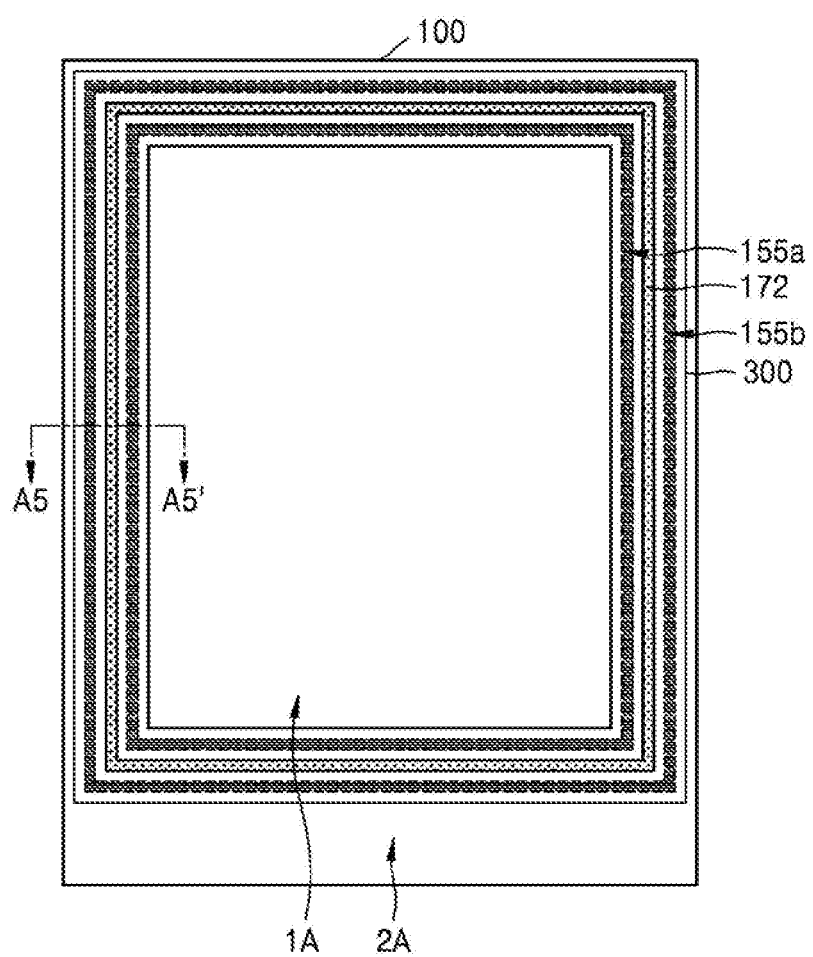
FIG. 11 is a schematic plan view of a display apparatus according to an exemplary embodiment of the present invention.
Figure 12:
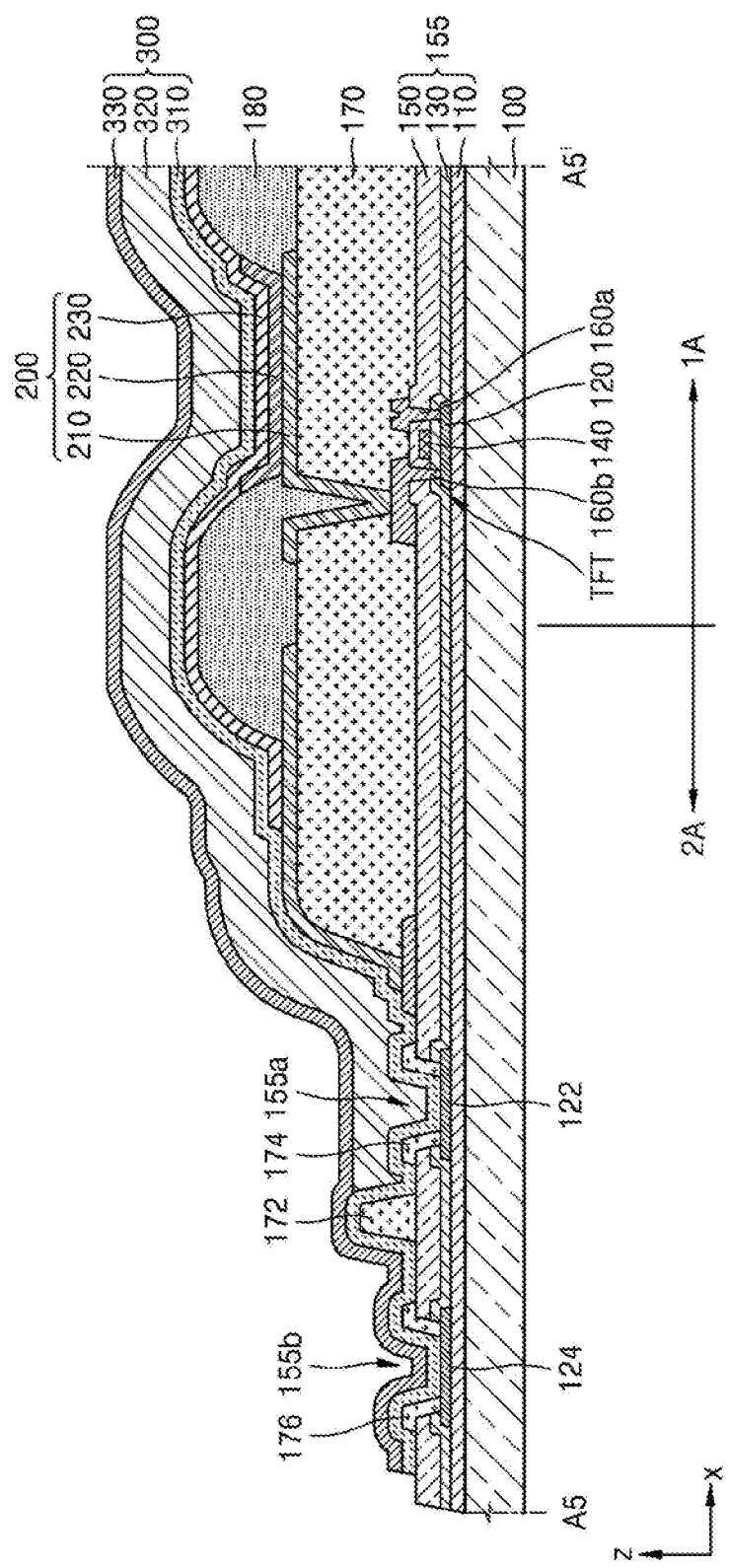
FIG. 12 is a schematic cross-sectional view taken along line A5-A5' of FIG. 11.

FIG. 11 is a schematic plan view of a display apparatus according to an exemplary embodiment of the present invention, and FIG. 12 is a schematic cross-sectional view taken along line A5-A5' of FIG. 11.

Referring to FIGS. 11 and 12, the display apparatus according to an exemplary embodiment of the present invention includes a substrate 100; an insulating part 155 disposed above the substrate 100 and having a first opening portion 155a and a second opening portion 155b; a dam part 172 disposed above the insulating part 155 and surrounding the periphery of the first opening portion 155a; a first organic insulating layer 174 covering an inner surface of the first opening portion 155a; an organic light-emitting device 200 disposed above the insulating part 155; and an encapsulation layer 300 covering the organic light-emitting device 200.

The approach illustrated in FIG. 12 differs from the above-described approaches, in that in the approach of FIG. 12, the second opening portion 155b is further included in addition to the first opening portion 155a.

Referring to FIG. 12, the insulating part 155 disposed above the substrate 100 may have the first opening portion 155a in the second region 2A, and the second opening portion 155b covering the periphery of the first opening portion 155a. The dam part 172 may be disposed between the first opening portion 155a and the second opening portion 155b. For example, the second opening portion 155b may cover the periphery of the dam part.

A second material layer 124 array be disposed at a position corresponding to the second opening portion 155b. The second material layer 124 may be disposed between a buffer layer 110 and a first insulating layer 130. Therefore, the second opening portion 155b may expose at least a portion of the second material layer 124, and may be formed so that the first insulating layer 130 covers the edge of the second material layer 124. As in the first material layer 122, in the manufacturing process of forming the first opening portion 155a, when the second opening portion 155b is formed through etching, the second material layer 124 may serve as an etch stopper to adjust a depth to be defined by the second opening portion 155b. As such, the depth of the second opening portion 155b may be controlled according to which layer the second material layer 124 is arranged on.

The second material layer 124 may include the same material as that of a semiconductor layer 120 of a thin film transistor TFT, but might not undergo a doping process as in the semiconductor layer 120. In one or more exemplary embodiments of the present invention, when the depth of the second opening portion 155b is formed to be relatively shallow, the second material layer 124 may include the same material as that of the gate electrode 140. In this case, the second material layer 124 may be disposed above the first insulating film.

A second organic insulating layer 176 may be disposed above the insulating part 155 and may cover the inner surface of the second opening portion 155b. The second organic insulating layer 176 covers the inner surface of the second opening portion 155b. Thus, even when the inner surface of the second opening portion 155b is not smoothly formed, it is possible to prevent a discontinuous formation of the first inorganic film 310 above the inner surface of the second opening portion 155b.

As described above, the first inorganic film 310 may cover the second opening portion 155b covered by the second organic insulating layer 176 and the first material layer 122, at least a portion of which is exposed by the second opening portion 155b. As illustrated, the first inorganic film 310 may be disposed above the entire surface of the substrate 100 over both the first region 1A and the second region 2A.

Above the insulating part 155 where the second opening portion 155b is arranged, the second inorganic film 330 may be disposed directly on the first inorganic film 310. For example, the first inorganic film 310 may come into surface contact with the second inorganic film 330 above the insulating film from the dam part 172 to the edge of the substrate 100.

Figure 13:
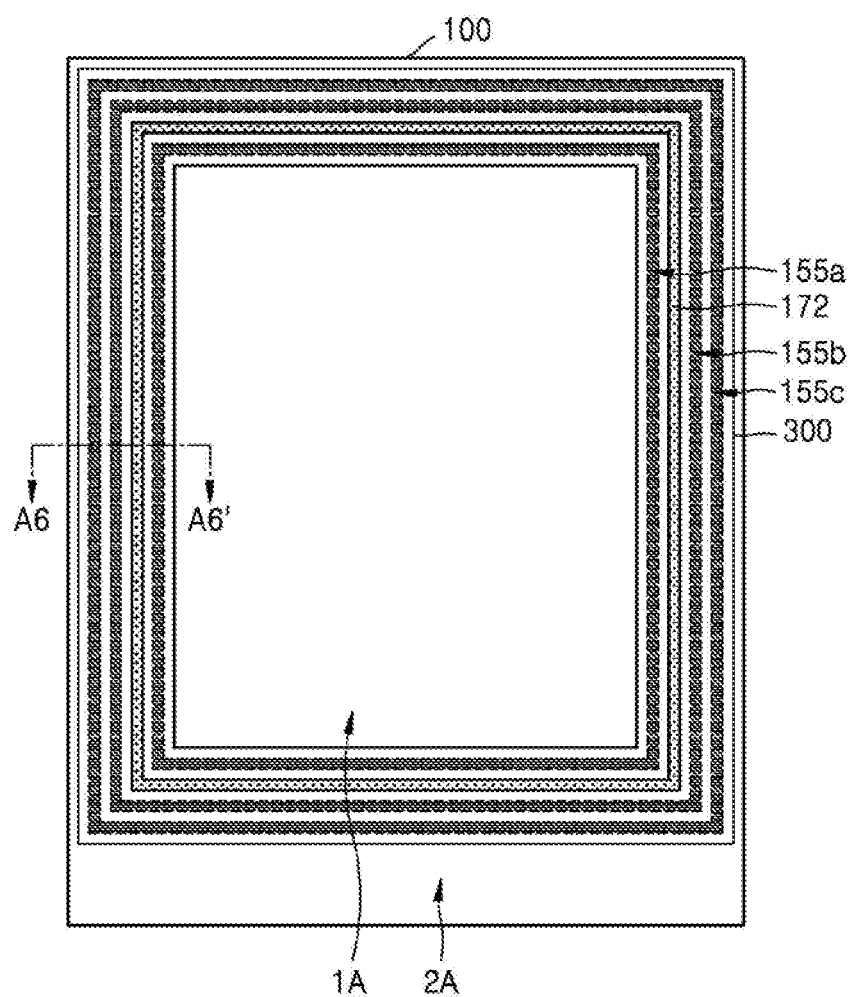
FIG. 13 is a schematic plan, view of a display apparatus according to an exemplary embodiment of the present invention.
Figure 14:
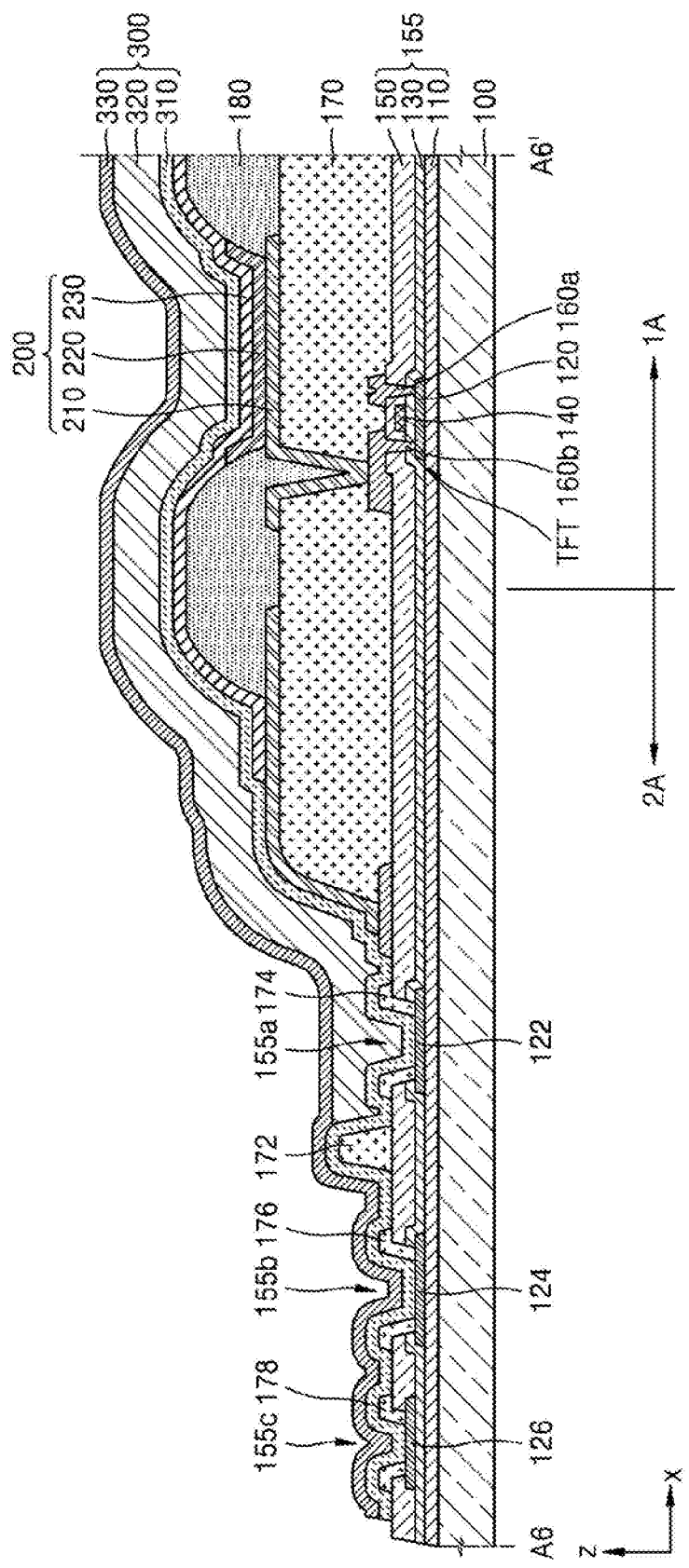
FIG. 14 is a schematic cross-sectional view taken along line A6-A6' of FIG. 13.

FIG. 13 is a schematic plan view of a display apparatus according to an exemplary embodiment of the present invention, and FIG. 14 is a schematic cross-sectional view taken along line A6-A6' of FIG. 13.

Referring to FIGS. 13 and 14, the display apparatus according to an exemplary embodiment of the present invention includes a substrate 100; an insulating part 155 disposed above the substrate 100 and having a first opening portion 155a, a second opening portion 155b, and a third opening portion 155c; a dam part 172 disposed above the insulating part 155, surrounding the periphery of the first opening portion 155a, and disposed between the first opening portion 155a and the second opening portion 155b; a first organic insulating layer 174 covering an inner surface of the first opening portion 155a; a second organic insulating layer 176 covering an inner surface of the second opening portion 155b; a first organic insulating layer 178 covering an inner surface of the third opening portion 155c; an organic light-emitting device 200 disposed above the insulating part 155; and an encapsulation layer 300 covering the organic light-emitting device 200.

The approach illustrated in FIG. 14 differs from the above-described approaches, in that the third opening portion 155c is further included in addition to the first opening portion 155a and the second opening portion 155b.

The approach illustrated in FIG. 155 differs from the above-described approaches, in that the third opening portion 155c is further included in addition to the first opening portion 155a and the second opening portion 155b. The third opening portion 155c may surround the periphery of the second opening portion 155b. For example, the first opening portion 155a may be in a region closest to the first region 1A so as to surround the periphery of the first region 1A where pixels are arranged. The dam part 172 may surround the periphery of the first opening portion 155a. The second opening portion 155b may surround the dam part 172. The third opening portion 155c may surround the second opening portion 155b.

As illustrated in FIG. 13, the third opening portion 155c may include an opening formed in the second insulating film 150. In this case, a third material layer 126 may be further above the first insulating film 130. The third opening portion 155c may expose at least a portion of the third material layer 126. The third material layer 126 may include the same material as that of a gate electrode 140 of a thin film transistor TFT.

In one or more exemplary embodiments of the present invention, as in the second opening portion 155b, an opening may be further formed in the first insulating film 130. In this case, the third material layer 126 may be disposed above a buffer layer 110 and may include the same material as that of a semiconductor layer 120 of the thin film transistor TFT.

In one or more exemplary embodiments of the present invention, the third opening portion 155c might not include the third material layer. In this case, the third opening portion 155c may expose at least a portion of the buffer layer 110.

Figure 15:
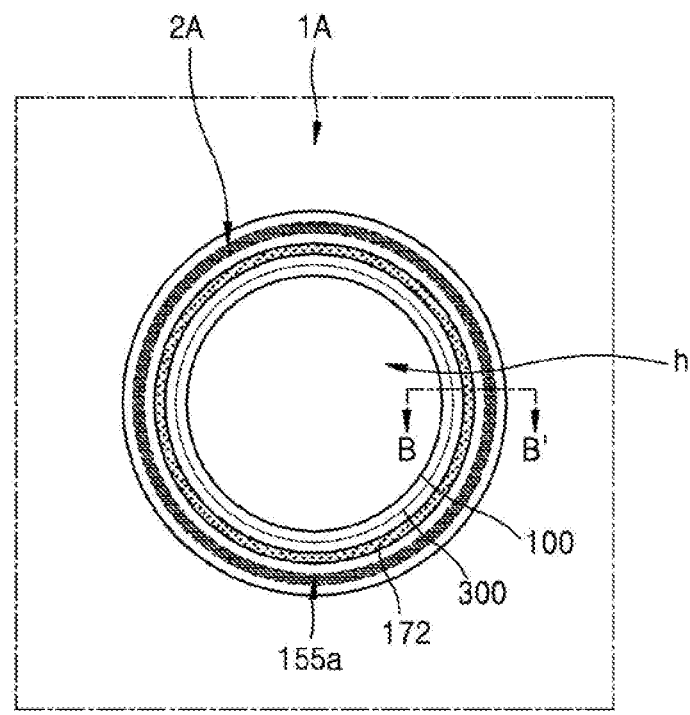
FIG. 15 is a schematic plan view of a display apparatus according to an exemplary embodiment of the present invention.
Figure 16:
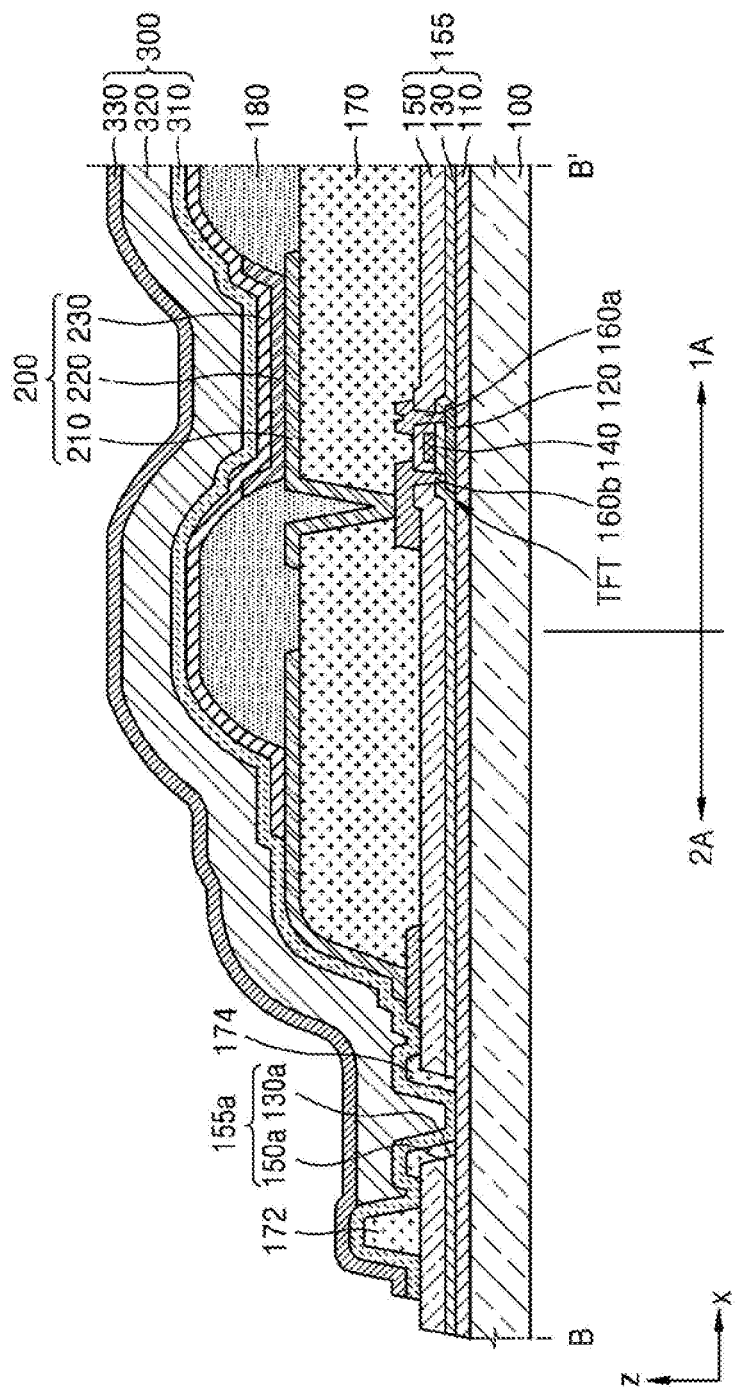
FIG. 16 is a schematic cross-sectional view taken along line B-B' of FIG. 15.

FIG. 15 is a schematic plan view of a display apparatus according to an exemplary embodiment of the present invention, and FIG. 16 is a schematic cross-sectional view taken along line B-B' of FIG. 15.

Referring to FIG. 15, the display apparatus according to an exemplary embodiment of the present invention may include a first region 1A as a display region where a plurality of pixels are arranged, and a second region 2A as a non-display region that surrounds the periphery of the first region 1A. A substrate 100 having a hole h may be provided in a certain region. The hole h may be disposed in the display region. The display apparatus may include a dam part 172 in the second region 2A surrounding the hole h, and an opening portion 1550 in the second region 2A surrounding the dam part 172 with respect to the edge of the substrate 100 where the hole h is formed.

Referring to FIGS. 15 and 16, the display apparatus according to an exemplary embodiment of the present invention includes a substrate 100; an insulating part 155 disposed above the substrate 100 and having a first opening portion 155a; a dam part 172 disposed above the insulating part 155 and surrounding the periphery of the first opening portion 155a; a first organic insulating layer 174 covering an inner surface of the first opening portion 155a; an organic light-emitting device 200 disposed above the insulating part 155; and an encapsulation layer 300 covering the organic light-emitting device 200.

The cross-sectional structure illustrated in FIG. 16 may be substantially similar to the cross-sectional structure illustrated in FIG. 2.

Also, in the display apparatus of FIG. 15, the cross-sectional structure taken along line B-B' is not limited to the arrangement illustrated in FIG. 16. In one or more exemplary embodiments of the present invention, the cross-sectional structure taken along line B-B' of FIG. 15 may have the cross-sectional structure of FIG. 2, 3, 4, 6, 8, 10, 12, or 14.

According to the related art, the second region 2A must have more than a certain width in order to prevent a damage to the display apparatus due to external moisture permeability. The encapsulation layer 300 therefore plays a major role in preventing external moisture permeability, and the region where the first inorganic film 310 and the second inorganic film 330 come into direct contact with each other will have more than a certain width. However, in this case, as the width of the second region 2A is increased in the periphery of the first region 1A, except for the first region 1A where pixels are arranged, the non-display region of the display apparatus, e.g., the dead space, is expanded.

According to an exemplary embodiment, since the insulating part 155 in the second region 2A has the first opening portion 155a and the organic film 320 is partially buried in the first opening portion 155a, the permeation of external moisture permeability through the side of the insulating film is blocked to thereby provide a display apparatus robustness to moisture permeation. Due to the first organic insulating layer 174 covering the inner surface of the first opening portion 155a, step coverage of the first inorganic film 310 may be increased. Also, due to the first opening portion 155a blocking the passage of moisture permeation, it is possible to narrow the non-display region of the display apparatus, that is, for example, the dead space.

As described above, according to one or more exemplary embodiments of the present invention, it is possible to provide the display apparatus that has an increased display region size and is robust to external moisture permeation.

While one or more exemplary embodiments of the present invention have been described herein with reference to the figures, it will be understood by those of ordinary skill in the art that various changes in form and details may be made therein without departing from the spirit and scope of the present disclosure.

What is claimed is:

1. A display apparatus comprising:
    a substrate having a first region and a second region surrounding the first region;
    an insulating part disposed above the substrate, covering the first region and the second region, and comprising a first opening portion in the second region;
    a dam part disposed above the insulating part in the second region and surrounding a periphery of the first opening portion;
    a first organic insulating layer disposed above the insulating part, the first organic insulating layer directly contacting and covering an inner surface of the first opening portion;
    an organic light-emitting device disposed above the insulating part in the first region and comprising a pixel electrode; and
    an encapsulation layer disposed above the insulating part in both the first region and the second region, the encapsulation layer covering the organic light-emitting device,
    wherein the encapsulation layer comprises a first inorganic film, a second inorganic film, and an organic film disposed between the first inorganic film and the second inorganic film, and at least a portion of the organic film is recessed within the first opening portion.

2. The display apparatus of claim 1, wherein the first inorganic film and the second inorganic film extend to an edge of the substrate and come into direct contact with each other in the second region.

3. The display apparatus of claim 1, wherein the organic film is fully enclosed by the second inorganic film and the first inorganic film.

4. The display apparatus of claim 1, wherein the first inorganic film covers the insulating part and the first organic insulating layer.

5. The display apparatus of claim 1, further comprising: a first material layer disposed between the substrate and the insulating part, wherein the first opening portion exposes at least a portion of the first material layer.

6. The display apparatus of claim 5, wherein the first organic insulating layer exposes at least a portion of the first material layer.

7. The display apparatus of claim 6, wherein the first inorganic film comes into direct contact with at least a portion of the first material layer.

8. The display apparatus of claim 5, further comprising: a thin film transistor disposed in the first region and comprising a semiconductor layer and a gate electrode, wherein the first material layer comprises a same material as the semiconductor layer.

9. The display apparatus of claim 1, wherein the insulating part is disposed above the substrate in both the first region and the second region and the insulating part comprises a first insulating layer, having a first opening corresponding to the first opening portion, and a second insulating layer, having a second opening corresponding to the first opening portion.

10. The display apparatus of claim 9, further comprising: a first metal layer disposed between the first insulating layer and the second insulating layer of the second region, and comprising a third opening corresponding to the first opening portion.

11. The display apparatus of claim 10, further comprising: a second metal layer disposed above the second insulating layer of the second region, and comprising a fourth opening corresponding to the first opening portion.

12. The display apparatus of claim 11, wherein the first organic insulating layer covers inner surfaces of the first opening, the second opening, the third opening, and the fourth opening.

13. The display apparatus of claim 11, further comprising: a thin film transistor disposed in the first region and comprising a semiconductor layer, a gate electrode, a source electrode, and a drain electrode, wherein the first metal layer comprises a same material as the gate electrode, and the second metal layer comprises a same material as the source electrode or the drain electrode.

14. A display apparatus comprising:
a substrate having a first region and a second region surrounding the first region;
an insulating part disposed above the substrate, covering the first region and the second region, and comprising a first opening portion in the second region;
a dam part disposed above the insulating part in the second region and surrounding a periphery of the first opening portion;
a first organic insulating layer disposed above the insulating part and covering an inner surface of the first opening portion;
an organic light-emitting device disposed above the insulating part in the first region and comprising a pixel electrode;
an encapsulation layer, disposed above the insulating part in both the first region and the second region, the encapsulation layer covering the organic light-emitting device;
a via layer disposed between the insulating part and the pixel electrode in the first region; and
a pixel defining film covering an edge of the pixel electrode and exposing a central portion thereof,
wherein the first organic insulating layer comprises a same material as the via layer or the pixel defining film.

15. The display apparatus of claim 14, wherein the dam part comprises a same material as the via layer or the pixel defining film.

16. The display apparatus of claim 1, wherein the insulating part further comprises a second opening portion surrounding a periphery of the dam part.

17. The display apparatus of claim 16, further comprising: a second organic insulating layer disposed above the insulating pan and covering an inner surface of the second opening portion, wherein the second organic insulating layer exposes at least a portion of the first material layer.

18. The display apparatus of claim 16, further comprising: a second material layer disposed between the substrate and the insulating part, wherein the second opening portion exposes at least a portion of the second material layer.

19. The display apparatus of claim 18, further comprising: a thin film transistor disposed in the first region, comprising a semiconductor layer and a gate electrode, wherein the second material layer comprises a same material as the semiconductor layer or the gate electrode.

20. A display apparatus, comprising:
a substrate;
an insulating layer disposed on the substrate and having a first opening and a second opening;
a thin film transistor (TFT) disposed within the first opening; and
an organic film disposed over the TFT and disposed within the second opening and overlapping an entirety of the second opening,
wherein a first inorganic film is disposed under the organic film,
wherein a second inorganic film is disposed over the organic film, and
wherein the organic film ends at a dam part disposed past the second opening of the insulating layer, in a direction from the TFT to the second opening of the insulating layer and the first and second inorganic films continue over and past the dam part without the organic film disposed therebetween.

* * * * *